(12) United States Patent
Harbers

(10) Patent No.: US 6,586,882 B1
(45) Date of Patent: Jul. 1, 2003

(54) LIGHTING SYSTEM

(75) Inventor: Gerard Harbers, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/551,029

(22) Filed: Apr. 17, 2000

(30) Foreign Application Priority Data

Apr. 20, 1999 (EP) .............................................. 99201247

(51) Int. Cl.[7] .......................... H01J 17/16; H01J 61/30; F21V 7/04; F21S 5/00
(52) U.S. Cl. ..................... 313/634; 313/510; 313/635; 313/110; 313/112; 362/555; 362/800; 362/806; 362/565; 362/566
(58) Field of Search ................... 313/491–93, 631–32, 313/634–35, 110, 112, 113, 500, 498, 501, 502, 505, 506, 507, 510, 511, 512; 362/46, 235, 227, 544–45, 260, 84, 230, 255, 800, 806–810, 293, 259, 499, 560, 565–69, 559

(56) References Cited

U.S. PATENT DOCUMENTS

| | | | | |
|---|---|---|---|---|
| 2,748,306 A | * | 5/1956 | Bjorkman .................... 313/485 |
| 3,593,055 A | * | 7/1971 | Geusic et al. ................ 313/501 |
| 3,932,881 A | * | 1/1976 | Mita et al. ............... 313/112 X |
| 4,904,901 A | * | 2/1990 | Simpoulos et al. ...... 313/510 X |
| 5,535,230 A | * | 7/1996 | Abe ........................ 362/259 X |
| 5,813,753 A | * | 9/1998 | Vriens et al. ............ 313/112 X |
| 5,847,507 A | * | 12/1998 | Butterworth et al. ........ 313/512 |
| 6,068,383 A | * | 5/2000 | Robertson et al. ............ 362/84 |
| 6,234,648 B1 | * | 5/2001 | Borner et al. ................ 362/235 |

FOREIGN PATENT DOCUMENTS

EP 0855751 A2 * 7/1998

* cited by examiner

*Primary Examiner*—Vip Patel
*Assistant Examiner*—Joseph Williams

(57) ABSTRACT

The lighting system comprises a body (1) to emit visible light and an envelope (5) which is transparent to light. The invention is characterized in that the lighting system comprises at least one opto-electronic element (2, 2') to emit light in a first wavelength range, in that the body (1) is provided with conversion means (3) for absorbing light emitted by the opto-electronic element (2, 2') and re-emitting light in a second wavelength range, and in that the envelope (5) is provided with a coating (6) reflecting light of the first wavelength range. In a preferred embodiment, the opto-electronic elements (2, 2') are light-emitting diodes, which preferably emit blue light. Preferably, the conversion means (3) consist of a luminescent material and can be excited, preferably, by light originating from the wavelength range of 400 to 500 nm. Preferably, the coating (6) comprises a multilayer optical filter and is, preferably, provided on an inside surface of the envelope (5). In operation, the luminous flux of the opto-electronic element is preferably equal to or higher than 5 lm. The body (1) may assume various shapes, such as a spiral-shaped coil, so that the lighting system resembles a carbon filament lamp. The lighting system according to the invention has a comparatively high luminous efficacy and a relatively long service life.

20 Claims, 2 Drawing Sheets

LIGHTING SYSTEM

BACKGROUND OF THE INVENTION

The invention relates to a lighting system comprising a body which, in operation, emits visible light and comprising an envelope which transmits light.

Lighting systems of the type mentioned in the opening paragraph are known per se and comprise, for example, incandescent lamps, such as decorative lamps, for example so-called carbon filament lamps, wherein the incandescent body comprises a spirally wound wire of carbon on a carrier material. Other examples of such lighting systems include lamps provided with a light-emitting body in the form of cross-shaped, star-shaped elements or other decorative or devotional elements (for example the letters "love").

It is a drawback of such lighting systems that the known lighting system has a relatively low luminous efficacy and a limited service life.

SUMMARY OF THE INVENTION

It is an object of the invention to provide a lighting system of the type mentioned in the opening paragraph, wherein the luminous efficacy and the service life are improved. To achieve this, the lighting system in accordance with the invention is characterized in that the lighting system comprises at least one opto-electronic element which, in operation, emits light in a first wavelength range, in that the body is provided with conversion means for converting light of the first wavelength range to light of a second wavelength range, and in that the envelope is provided with a coating which at least partly reflects light of the first wavelength range.

Opto-electronic elements include electro-luminescent elements, such as light-emitting diodes (LEDs). Such opto-electronic elements are used as a source of white or colored light for general lighting purposes and as a source of colored or white light in signal lamps, for example in traffic control systems, vehicles, aircraft or other means or systems of transport. In recent years, apart from yellow and red light emitting diodes on the basis of GaP, efficient blue and green light emitting diodes on the basis of GaN have been developed. Such opto-electronic elements have a relatively high luminous efficacy ($\geq 20$ lm/W) and a relatively long service life ($\geq 75,000$ hours). By way of comparison, a 75 W carbon filament lamp has a luminous efficacy of approximately 2 lm/W and an average service life of less than 1,000 hours.

In operation, in the known lamp light is generated in that the (incandescent) body in a (vacuumtight) envelope is heated by means of an electric current, causing said body to emit light at a high temperature. In the known lamp, the (incandescent) body constitutes the so-called primary light source. In accordance with the invention, the (incandescent) body of the known lighting system has been replaced by a combination of at least an opto-electronic element and (a body provided with) conversion means which convert light, which is emitted by the opto-electronic element in a first wavelength range, to light in a second wavelength range. In the lighting system in accordance with the invention, the opto-electronic element is considered to be a primary light source, and the conversion means are considered to be a secondary light source. The conversion means are excited by light originating from the opto-electronic element. A part of this light is converted by the conversion means, for example via a process of absorption and emission, to (visible) light in the second wavelength range.

In accordance with the invention, the light-transmitting envelope further comprises a coating which at least partly reflects light of the first wavelength range. As a result, it is achieved that light of the first wavelength range, which originates from the opto-electronic element and which is not directly absorbed by the conversion means and converted to light in the second wavelength range, is reflected by the reflective coating applied to (an inner surface of) the envelope and still absorbed by the conversion means and converted to light in the second wavelength range. Light originating from the conversion means is allowed to pass by the envelope coated with the reflective layer. The reflective coating causes the body which, in principle, is irradiated only from below to be a homogeneously radiating body.

In accordance with the measure of the invention, a high-efficacy lighting system having a relatively long service life is obtained. In the lighting system in accordance with the invention, the envelope no longer serves as a vacuum envelope but as a means for providing the reflective coating. As a result of the fact that the lamp in accordance with the invention no longer has a vacuum envelope, said lamp in accordance with the invention is also safer to use. The envelope provided with the reflective coating may also be omitted, if so desired. The lighting system then comprises a combination of at least an opto-electronic element and (a body provided with) conversion means.

Preferably, the conversion means comprise a luminescent material. Such materials are particularly suitable because they generally have a high quantum efficiency and a high lumen equivalent (expressed in lm/W), so that a high luminous efficacy of the lighting system is achieved. In addition, a great variety of (stable) inorganic and organic luminescent materials (phosphors) is known, which makes it easier to choose a suitable material for achieving the object of the invention (improving the color rendition).

The luminescent material can preferably be excited by light originating from the wavelength range of 400 to 500 nm. As a result of this sensitivity, the luminescent material can particularly suitably be used to absorb, in particular, blue light. This absorbed light is very efficiently converted by the luminescent material to visible light in the further wavelength range, for example green or red light. The desired color temperature of the lighting system depends on the application. For a lighting system in the form of a look-alike of a carbon filament lamp, a relatively low color temperature is desired. For other applications, light having a high color temperature may be obtained.

A particularly attractive embodiment of the lighting system in accordance with the invention is characterized in that the at least one opto-electronic element is at least one solid-state electroluminescent element, which preferably comprises a blue light-emitting diode, and that the conversion means comprise a luminescent material for converting a part of the light emitted by the blue lightemitting diode to red light.

Preferably, the maximum of the spectral emission of the blue light-emitting diode lies in the wavelength range from 460 to 490 nm, and the maximum of the spectral emission of the red light-emitting luminescent material lies in the wavelength range from 610 to 630 nm.

In a favorable embodiment of the lighting system in accordance with the invention, a luminous flux of the opto-electronic element is, during operation, at least 5 lm. The invented lighting system enables a continuous, uniform illumination with a high intensity to be obtained. It has been found that opto-electronic elements having a luminous flux of 5 lm or more can only be applied in an efficacious manner if the lighting system comprises heat-dissipating means. Only lighting systems provided with opto-electronic elements having such a high luminous flux can replace customary incandescent lamps. A particular aspect of the invention resides in that the heat-dissipating means dissipate the heat generated during operation of the lighting system to a lamp cap of the lighting system and/or the mains supply connected thereto.

These and other aspects of the invention will be apparent from and elucidated with reference to the embodiment(s) described hereinafter.

BRIEF DESCRIPTION OF THE DRAWING

In the drawing.

The Figures are purely diagrammatic and not drawn to scale. Particularly for clarity, some dimensions are exaggerated strongly. In the Figures, like reference numerals refer to like parts whenever possible.

DESCRIPTION OF THE PREFERRED EMBODIMENTS

Figure 1:
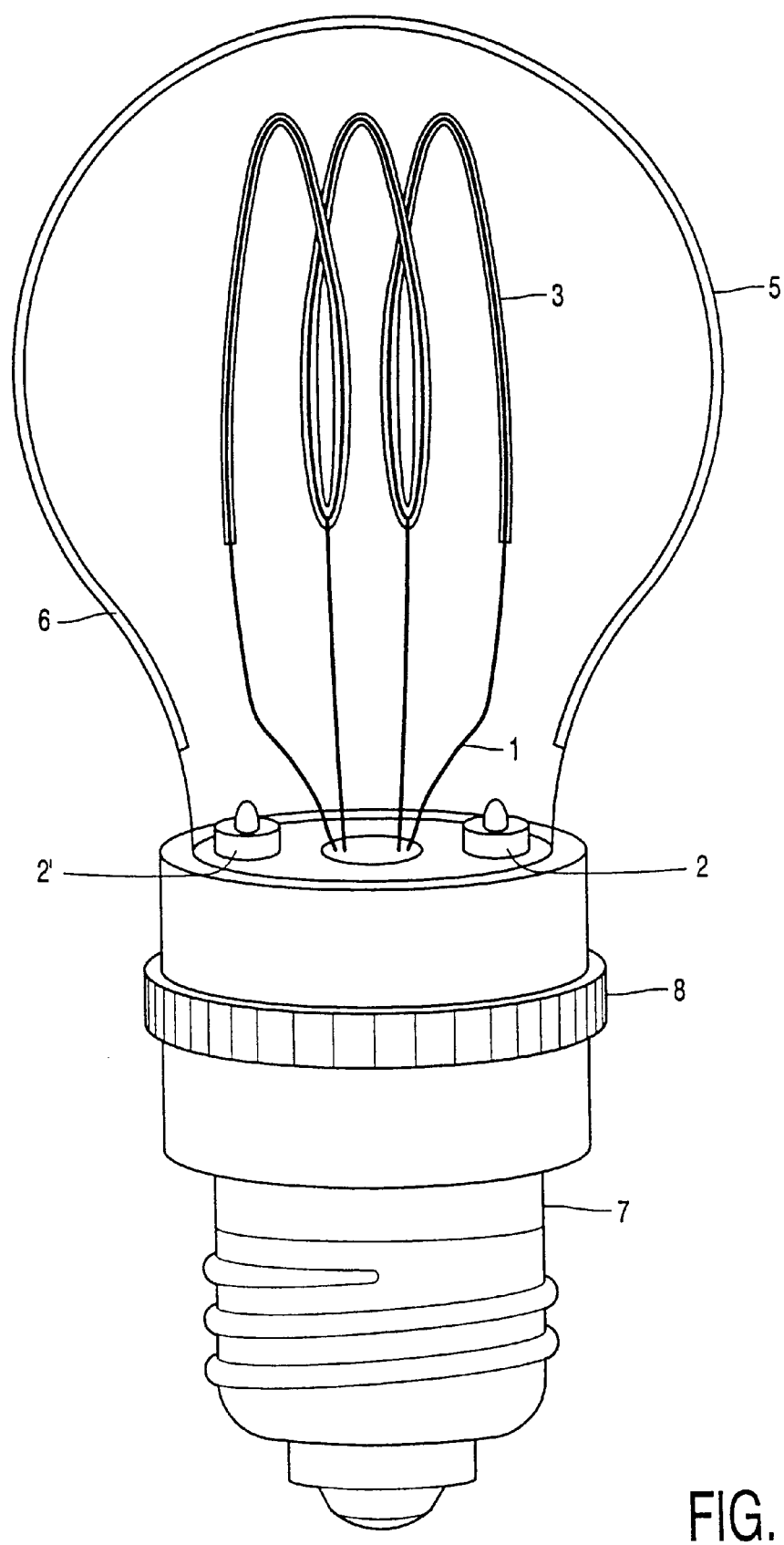
FIG. 1 shows, partly in cross-section and partly in side-elevation, a first embodiment of the lighting system in accordance with the invention.

FIG. 1 shows an embodiment of the lighting system in accordance with the invention, partly in cross-section and partly in side-elevation. Said lighting system comprises, in this example, a body 1 in the form of a spirally wound wire. The lighting system further comprises an envelope 5 which is light-transmitting and a lamp cap 7 which is known per se. In accordance with the invention, the lighting system includes at least one opto-electronic element 2, 2'. In the example of FIG. 1, two opto-electronic elements 2, 2' are shown. Such opto-electronic elements are composed of a body for generating and emitting light in a predetermined wavelength range, during operation, and they are generally provided with a light-transmitting envelope, for example in the form of a lens. Suitable opto-electronic elements 2, 2' are so-called electroluminescent elements, for example light-emitting diodes (LEDs), such as diodes emitting light of a specific color. Suitable LEDs include, inter alia, blue GaN LEDs (make Nichia): emission maximum: 470 nm, FWHM=20 nm;

blue-green GaN LEDs (make Nichia): emission maximum: 520 nm, FWHM=40 nm;

yellow GaP LEDs (make Hewlett Packard): emission maximum: 590 nm, FWHM=20 nm.

The body 1 is provided with conversion means 3. Said conversion means 3 are excited by light originating from the opto-electronic element 2, 2'. A part of this light is converted by the conversion means 3 to (visible) light in the second wavelength range. In the example of FIG. 1, the body 1 is not entirely provided with conversion means 3. The parts of the body 1 which do not have to emit light are not provided with the conversion means 3.

The conversion means 3 preferably comprise a luminescent material. Suitable luminescent materials for converting blue light to green light are: $(Sr,Ca)_2SiO_4$: $Eu^{2+}$, $Ba_2SiO_4$: $Eu^{2+}$, $SrGa_2S_4$, ZnS: $Cu^+$, ZnS: $Au^+$, ZnS: $Al^{3+}$ and CaS: $Ce^{3+}$. Suitable luminescent materials for converting blue light or green light to red light are: CaS: Eu,Mn; CaS: Eu; SrS: Eu; (Zn,Cd)S: Ag; SrO: Eu; $Sr_3B_2O_6$: Eu; $Sr_2Mg(BO_3)_2$; CaS: Eu,Mn; CaS: Eu or SrS: Eu. Said materials have a relatively high quantum efficiency and light absorption. These materials further have a relatively very high lumen equivalent upon converting light from the first wavelength range to light of the second wavelength range.

The (visible) light-transmitting envelope 5 of the lighting system is provided with a coating which (partly) reflects light of the first wavelength range. As a result thereof, light of the first wavelength range which originates from the opto-electronic element 2, 2', and which is not directly, or not completely, converted to light in the second wavelength range by the conversion means 3 is reflected by the reflective coating 6 applied to the envelope 5 and still converted by the conversion means 3 to light in the second wavelength range. Light originating from the conversion means 3 is passed by the envelope 54 coated with the reflective coating 6.

Preferably, the coating 6 comprises a multilayer reflective coating. Such coating layers can be readily applied by means of coating techniques which are known per se (vapor deposition, sputtering, chemical vapor deposition, dip coating). A suitable coating layer comprises a coating composed of a stack of relatively thin layers of a material having alternately a high and a low refractive index, for example $Nb_2O_5$, $Ta_2O_5$ or $Si_3N_4$ being used as the material having a high refractive index, and, for example $SiO_2$ or $MgF_2$ being used as the material having a low refractive index. By a suitable choice of the respective layer thicknesses, the desired reflection spectrum is obtained.

Preferably, the coating 6 reflects blue light. If the opto-electronic element 2, 2' emits blue light, this light, provided it is not converted by the conversion means 3, is reflected by the coating 6, so that such light cannot leave the envelope 5. Light originating from the conversion means 3 is passed by the envelope 5 coated with the reflective layer. Consequently, the lighting system in accordance with the invention has a body which, in operation, emits visible light.

Preferably, the coating 6 is provided at a surface of the envelope 5 which is directed towards the body 1. By virtue thereof, damage to the coating during operation of the lighting system is precluded.

In the example of FIG. 1, the lighting system is provided with an adjusting ring 8 for changing the luminous flux of the opto-electronic element. This adjusting ring 8 enables the lighting system to be dimmed, as it were. The lighting system may also be provided with a second adjusting ring (not shown in FIG. 1) by means of which the luminous flux of the opto-electronic elements 2, 2' can be changed with respect to each other. The lamp may also be provided with a third adjusting ring (not shown in FIG. 1) by means of which the color and/or the color temperature of the light emitted by the lighting system can be changed. Said adjusting rings may also be integrated so as to form a single adjusting ring having various adjustment positions. The lighting system may additionally be provided with extra opto-electronic elements, for example of a different color, so that the desired color rendering index of the lighting system is obtained.

The lighting system in the embodiment shown in FIG. 1 is a look-alike of a carbon filament lamp because the body 1 comprises a spirally wound wire which, in operation, emits visible light, and because the lighting system is provided with a light-transmitting envelope. The conversion means on the spiral convert blue light originating from the opto-electronic elements to visible light in a higher wavelength range than that of the blue light. In comparison with the known lighting system, the lighting system in accordance with the invention has the advantage that a relatively high luminous efficacy ($\geq 20$ lm/W) of the system and a very long service life ($\geq 75,000$ hours) are achieved.

Figure 2A:
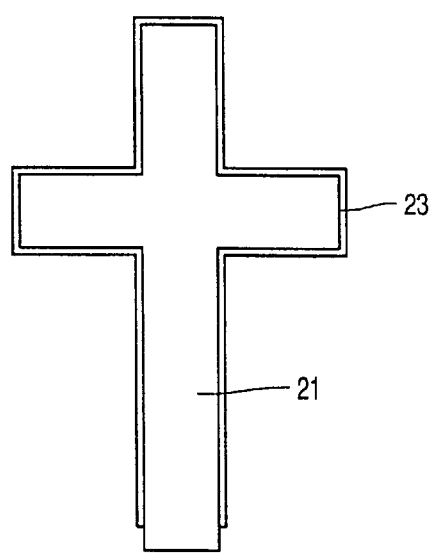
FIG. 2A is a cross-sectional view of an embodiment of the body in accordance with the invention.
Figure 2B:
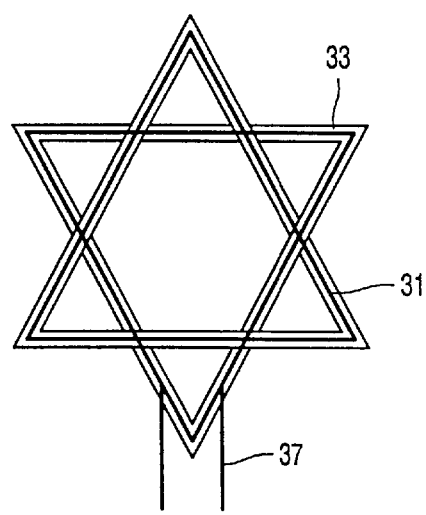
FIG. 2B is a cross-sectional view of an alternative embodiment of the body in accordance with the invention.
Figure 2C:
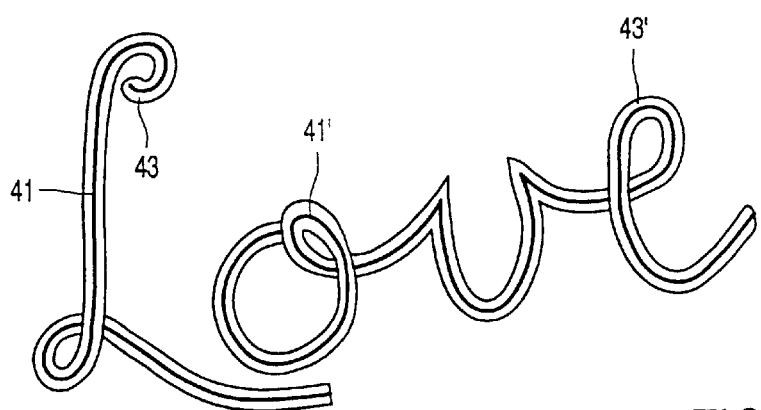
FIG. 2C is a cross-sectional view of a further alternative embodiment of the body in accordance with the invention.

FIGS. 2A, 2B and 2C diagrammatically show cross-sectional views of various embodiments of the body in accordance with the invention. FIG. 2A shows a body in the form of a cross-shaped element 21 provided with conversion means 23. FIG. 2B shows a body in the form of a star-shaped element 31 provided with conversion means 33 and supporting means 37. In general, the supporting means 37 are not provided with a coating. FIG. 2C shows a body in the form of a decorative element 41, 41' provided with conversion means 43, 43'. FIG. 2C does not show supporting means which are used to secure the decorative element 41, 41' to the lamp cap.

It will be clear that within the scope of the invention, many variations are possible to those skilled in the art. For example, the shapes of the bodies are not limited to the shapes shown in FIGS. 1, 2A, 2B and 2C. Many alternative embodiments are possible, such as (three-dimensional) bodies in the form of so-called devotional elements, such as statues in the form of (saint's) figures. Other alternative embodiments include models of architectural origin or pictures or other (two-dimensional) images which are provided with luminescent materials (by the user) at suitable locations (for example at the edge). The body may alternatively (partly) allow passage of (visible) light, so that the opto-electronic elements are hidden underneath the body and constitute a part of the lighting system which is invisible to the observer. The application of the conversion means is not limited to one type thereof. Alternatively, a combination of conversion means or luminescent materials may be used. Furthermore, also various parts of the body may be coated with different conversion means, so that these parts may have a different color. By suitable combinations of opto-electronic elements and conversion means, various light and color effects can be achieved, which can be adjusted (via an adjusting ring) by the user. For example, by a suitably chosen combination of blue and green opto-electronic elements with a phosphor which is sensitive to both blue and green light and which emits red light, a color effect can be obtained by changing the balance between blue and green light. In this case, it is desirable for the reflective coating to partly reflect both blue and green light. The envelope of the lighting system provided with the reflective coating may be omitted, if so desired. In this case, the lighting system comprises a combination of at least one opto-electronic element and (a body provided with) conversion means. It is also possible to omit the reflective layer. In this case, the body is irradiated only from below and no longer emits light homogeneously.

The scope of protection of the invention is not limited to the above examples. The invention is embodied in each new characteristic and each combination of characteristics. Reference numerals in the claims do not limit the scope of protection thereof. The use of the term "comprising" does not exclude the presence of elements other than those mentioned in the claims. The use of the term "a" or "an" before an element does not exclude the presence of a plurality of such elements.

What is claimed is:

1. A lighting system comprising a shaped body disposed in an envelope which transmits light, said lighting system comprising at least one opto-electronic element which includes means for emitting light in a first wavelength range, said body being separate from and spaced from said envelope, and separate from said at least one opto-electronic element, and said body being provided with conversion means for converting light of the first wavelength range to light of a second wavelength range for transmission through the envelope, and said envelope being provided with a coating which at least partly reflects light of the first wavelength range toward the conversion means.

2. A lighting system as claimed in claim 1, characterized in that the conversion means comprises a luminescent material.

3. An opto-electronic element as claimed in claim 2, characterized in that the opto-electronic element comprises a light-emitting diode.

4. A lighting system as claimed in claim 1, characterized in that the conversion means is excited by light originating from the wavelength range of 400 to 500 nm.

5. A lighting system as claimed in claim 1, characterized in that the coating comprises a multilayer reflective coating.

6. A lighting system as claimed in claim 1, characterized in that the coating reflects blue light.

7. A lighting system as claimed in claim 1, characterized in that the coating is provided at a surface of the envelope which is directed toward the body.

8. A lighting system as claimed in claim 1, characterized in that the body comprises a spirally wound wire.

9. A lighting system as claimed in claim 1, characterized in that the body comprises a cross-shaped element, a star-shaped element or other shape of decorative element.

10. A lighting system as claimed in claim 1, characterized in that, in operation, a luminous flux of the opto-electronic element (2, 2') is at least 5 lm.

11. A lighting system as claimed in claim 1, characterized in that the body has a surface on which the conversion means are provided.

12. A lighting system as claimed in claim 11, characterized in that the body has a further surface portion free from said conversion means.

13. A lighting system comprising a shaped body disposed in an envelope which transmits light, said lighting system comprising at least one solid-state electroluminescent element which includes means for emitting light in a first wavelength range, said envelope and said at least one element each having a respective shape, and said body having a body shape independent of the respective shapes, said body being provided with conversion means for converting light of the first wavelength range to light of a second wavelength range for transmission through the envelope, and said envelope being provided with a coating which at least partly reflects light of the first wavelength range toward the conversion means.

14. A lighting system as claimed in claim 13, characterized in that said first wavelength range is 400 to 500 nm.

15. A lighting system as claimed in claim 14, characterized in that the system comprises an adjusting ring for adjusting the color balance of said light of a second wavelength range.

16. A lighting system as claimed in claim 13, characterized in that the system further comprises a lamp cap, and means for dissipating heat generated by said electroluminescent element to said lamp cap.

17. A lighting system as claimed in claim 16, characterized in that said electroluminescent element produces at least 5 lm luminous flux.

18. A lighting system as claimed in claim 17, characterized in that said first wavelength range is 400 to 500 nm.

19. A lighting system as claimed in claim 18, characterized in that said electroluminescent element is a blue-light-emitting diode having a maximum of spectral emission in the wavelength range of 460 to 490 nm.

20. A lighting system as claimed in claim 19, characterized in that said means for converting light comprises a red luminescent material having a maximum of spectral emission in the wavelength range of 610 to 630 nm.

* * * * *